(12) United States Patent
Kobayashi et al.

(10) Patent No.: US 9,144,967 B2
(45) Date of Patent: Sep. 29, 2015

(54) PIEZOELECTRIC ACTUATOR, LIQUID DISCHARGE HEAD, AND RECORDING DEVICE

(75) Inventors: Naoki Kobayashi, Kyoto (JP); Takahiro Nakamura, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/002,365

(22) PCT Filed: Mar. 27, 2012

(86) PCT No.: PCT/JP2012/057897
§ 371 (c)(1),
(2), (4) Date: Aug. 30, 2013

(87) PCT Pub. No.: WO2013/014977
PCT Pub. Date: Jan. 31, 2013

(65) Prior Publication Data
US 2013/0335486 A1    Dec. 19, 2013

(30) Foreign Application Priority Data

Jul. 28, 2011    (JP) .................................. 2011-165649

(51) Int. Cl.
*B41J 2/045* (2006.01)
*B41J 2/14* (2006.01)
*H01L 41/047* (2006.01)

(52) U.S. Cl.
CPC .............. *B41J 2/045* (2013.01); *B41J 2/14209* (2013.01); *H01L 41/047* (2013.01); *B41J 2002/14217* (2013.01); *B41J 2002/14225* (2013.01); *B41J 2002/14306* (2013.01);
(Continued)

(58) Field of Classification Search
None
See application file for complete search history.

(56) References Cited

U.S. PATENT DOCUMENTS

2003/0001931 A1* 1/2003 Isono ............................. 347/72
2003/0085961 A1   5/2003 Furuhata
(Continued)

FOREIGN PATENT DOCUMENTS

EP    1336488 A2     8/2003
EP    1336489 A2 *   8/2003
(Continued)

OTHER PUBLICATIONS

International Search Report, PCT/JP2012/057897, May 30, 2012, 2 pp.
(Continued)

*Primary Examiner* — Erica Lin
(74) *Attorney, Agent, or Firm* — Volpe and Koenig, P.C.

(57) ABSTRACT

A piezoelectric actuator has a satisfactory electrical connection of a common electrode and a surface electrode without increasing the size of the piezoelectric actuator, as well as a liquid discharge head and a recording device. The piezoelectric actuator includes: a ceramic substrate which is long in one direction and includes a vibrating plate, a common electrode disposed on the vibrating plate and a piezoelectric ceramic layer disposed on the common electrode and having a plurality of first through holes connected to the common electrode; a plurality of individual electrodes disposed in a region of the piezoelectric ceramic layer opposed to the common electrode; and a plurality of first surface electrodes respectively disposed inside a plurality of the first through holes in the piezoelectric ceramic layer and on a circumference of a plurality of the first through holes.

20 Claims, 6 Drawing Sheets

(52) U.S. Cl.
CPC .............. *B41J 2002/14459* (2013.01); *B41J 2002/14491* (2013.01); *B41J 2202/18* (2013.01)

(56) References Cited

U.S. PATENT DOCUMENTS

| | | |
|---|---|---|
| 2003/0156164 A1 | 8/2003 | Sakaida et al. |
| 2004/0041885 A1 | 3/2004 | Hirota |
| 2004/0090498 A1 | 5/2004 | Sakaida et al. |
| 2005/0062807 A1 | 3/2005 | Ito et al. |
| 2005/0269913 A1 | 12/2005 | Sasaki et al. |
| 2007/0236544 A1 | 10/2007 | Ito et al. |
| 2007/0278901 A1 * | 12/2007 | Isono .................. 310/328 |

FOREIGN PATENT DOCUMENTS

| | | |
|---|---|---|
| EP | 1336490 A2 | 8/2003 |
| EP | 1516732 A1 | 3/2005 |
| EP | 2213456 A2 | 8/2010 |
| JP | 2003305852 A | 10/2003 |
| JP | 2005088516 A | 4/2005 |
| JP | 2005219325 A | 8/2005 |
| JP | 2006237247 A | 9/2006 |

OTHER PUBLICATIONS

Extended European Search Report, European Patent Application No. 12818120.3, Mar. 24, 2015, 5 pages.

* cited by examiner

PIEZOELECTRIC ACTUATOR, LIQUID DISCHARGE HEAD, AND RECORDING DEVICE

FIELD OF INVENTION

The present invention relates to a piezoelectric actuator, a liquid discharge head and a recording device.

BACKGROUND

Recently, printing devices using inkjet recording method, such as inkjet printers or inkjet plotters, have been widely used in not only printers for general consumers but also industrial purposes of color filter manufacturing, such as for electronic circuit formation or liquid crystal displays, and organic EL display manufacturing.

In this type of inkjet printing device, liquid discharge heads for discharging liquid are mounted as a printing head. As an example of the liquid discharge heads, there is known one configured by stacking one upon another a passage member including a manifold (common passage) and discharge holes respectively connected from the manifold via a plurality of pressurizing chambers, and an actuator unit including a plurality of displacement elements respectively disposed so as to cover the pressurizing chambers (refer to, for example, patent document 1).

In the liquid discharge head, the displacement elements is made up of a common electrode disposed substantially over the entire surface of a piezoelectric actuator, an individual electrode opposed to the common electrode, and a piezoelectric ceramic layer held between the common electrode and the individual electrode. A connection of the common electrode and the exterior is established via a penetrating conductor disposed in the piezoelectric ceramic layer at a circumferential edge of the piezoelectric actuator and via a surface electrode formed in the circumferential edge of the piezoelectric actuator. In the liquid discharge head, the pressurizing chambers respectively connected to a plurality of the discharge holes are arranged in a matrix shape, and the displacement elements of the actuator unit are arranged so as to cover the pressurizing chambers. Ink is discharged from the individual discharge holes by displacing these displacement elements, thus permitting printing at a resolution of, for example, 600 dpi in a main scanning direction.

PRIOR ART DOCUMENT

Patent Document

Patent document 1: Japanese Unexamined Patent Publication No. 2003-305852

SUMMARY

Problems to be Solved by the Invention

However, the piezoelectric actuator described in the patent document 1 has the problem that misregistration of the penetrating conductor and the surface electrode is apt to occur due to variations in contraction of the piezoelectric ceramic layer. Although it is possible to cope with the misregistration by increasing the size of the surface electrode, the size of the piezoelectric actuator is increased with increasing the size of the surface electrode.

Therefore, an object of the present invention is to provide a piezoelectric actuator that achieves a satisfactory electrical connection of the common electrode and the surface electrode without increasing the size of the piezoelectric actuator, as well as a liquid discharge head and a recording device.

Means for Solving the Problems

According to an embodiment of the piezoelectric actuator of the present invention, the piezoelectric actuator includes: (i) a ceramic substrate that is long in one direction and includes a vibrating plate, a common electrode disposed on the vibrating plate, and a piezoelectric ceramic layer disposed on the common electrode and including a plurality of first through holes connected to the common electrode; (ii) a plurality of individual electrodes disposed in a region of the piezoelectric ceramic layer opposed to the common electrode; and (iii) a plurality of first surface electrodes respectively disposed inside a plurality of the first through holes in the piezoelectric ceramic layer and on a circumference of a plurality of the first through holes. A plurality of the first through holes are arranged along the one direction at a central part of the ceramic substrate in a direction orthogonal to the one direction. The first surface electrodes are long in the one direction.

According to an embodiment of the liquid discharge head of the present invention, the liquid discharge head includes: the foregoing piezoelectric actuator and a passage member including a plurality of discharge holes and a plurality of pressurizing chambers respectively connected to a plurality of the discharge holes. A plurality of the pressurizing chambers and a plurality of the individual electrodes are overlappedly stacked one upon another on a side of the piezoelectric actuator located closer to the vibrating plate.

According to an embodiment of the recording device of the present invention, the recording device includes: the foregoing liquid discharge head; a conveyance section for conveying a recording medium to the liquid discharge head; and a control section for controlling a voltage applied to a plurality of the individual electrodes.

Effect of the Invention

According to the present invention, the electrical connection of the common electrode and the surface electrode via the piezoelectric ceramic layer can be improved without increasing the size of the piezoelectric actuator.

DETAILED DESCRIPTION OF THE PREFERRED EMBODIMENTS

Figure 1:
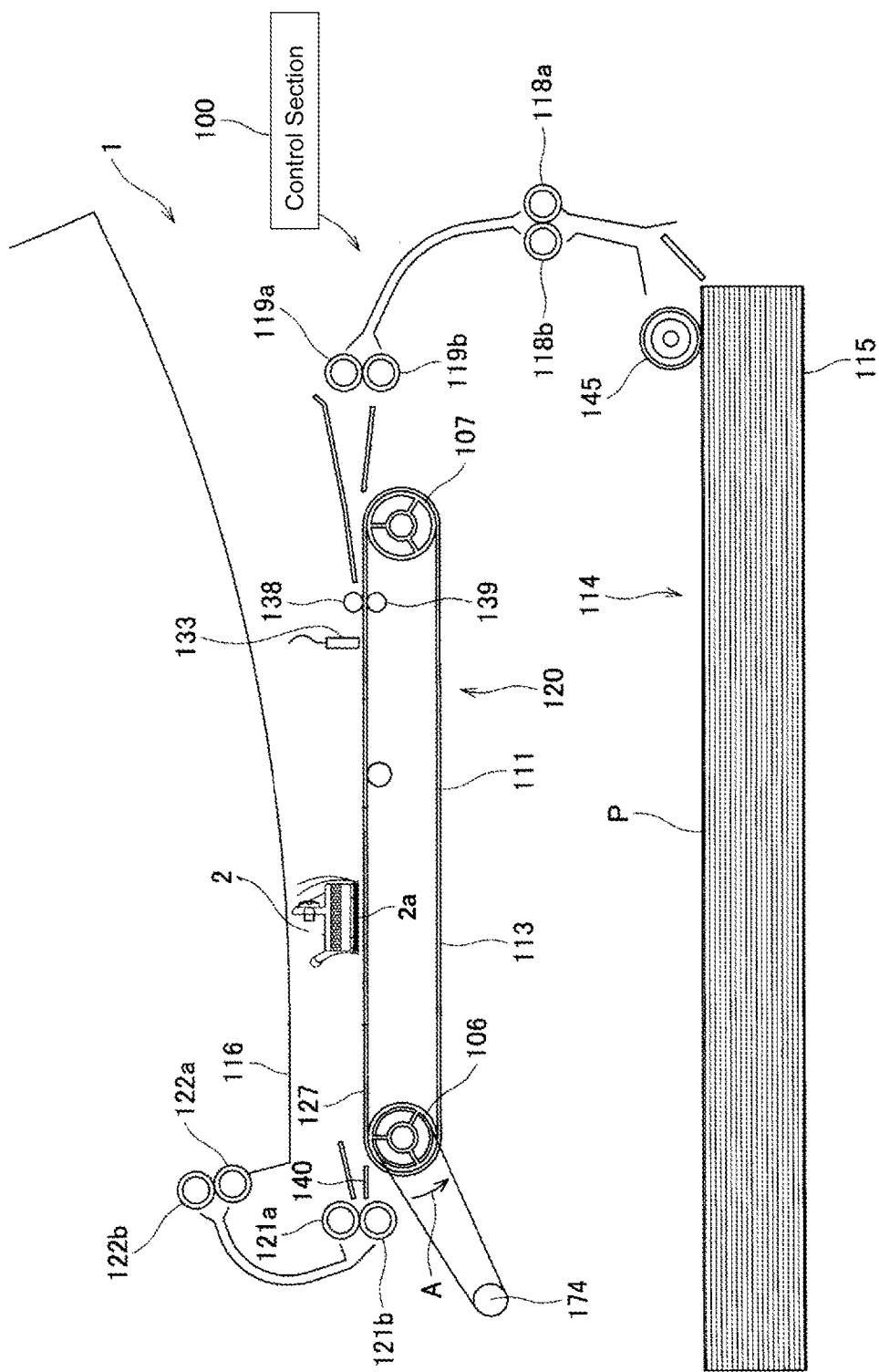
FIG. 1 is a schematic block diagram showing a color inkjet printer that is a recording device including a liquid discharge head according to an embodiment of the present invention.

FIG. 1 is the schematic block diagram of the color inkjet printer that is the recording device including the liquid discharge head according to an embodiment of the present invention. The color inkjet printer 1 (hereinafter referred to as the printer 1) includes the liquid discharge head 2. The liquid discharge head 2 is fixed to the printer 1. The liquid discharge head 2 has a long shape elongated in a direction in which it extends from the near side to the far side in FIG. 1. This elongated direction is referred to as a longitudinal direction in some cases.

The printer 1 includes a paper feed unit 114, a conveyance unit 120 and a paper receiving part 116 which are disposed in order along a conveyance passage of a printing paper P. The printer 1 further includes a control section 100 for controlling operations in components of the printer 1, such as the liquid discharge head 2 or the paper feed unit 114.

The paper feed unit 114 includes a paper storage case 115 for storing a plurality of printing papers P, and a paper feed roller 145. The paper feed roller 145 feeds out the uppermost located printing paper P one by one among the printing papers P stackedly stored in the paper storage case 115.

Two pairs of feed rollers 118a, 118b, 119a and 119b are disposed between the paper feed unit 114 and the conveyance unit 120 along the conveyance passage of the printing papers P. The printing paper P fed out of the paper conveyance unit 114 is guided and fed out to the conveyance unit 120 by these feed rollers 118a, 118b, 119a and 119b.

The conveyance unit 120 includes a conveyance belt 111 and two belt rollers 106 and 107. The conveyance belt 111 is entrained around the belt rollers 106 and 107. The length of the conveyance belt 111 is adjusted so that the conveyance belt 111 is stretched at a predetermined tension when entrained around the two belt rollers 106 and 107. Consequently, the conveyance belt 111 is stretched without being loosen along two planes parallel to each other which respectively include a common tangent of the two belt rollers 106 and 107. One of these two planes which is located more closer to the liquid discharge head 2 is a conveyance surface 127 along which the printing paper P is conveyed.

As shown in FIG. 1, the belt roller 106 is configured to connect a conveyance motor 174 thereto. The conveyance motor 174 rotates the belt roller 106 in a direction of arrow A. The belt roller 107 is rotatable interlockingly with the conveyance belt 111. Therefore, the belt roller 106 is rotated by driving the conveyance motor 174, and the conveyance belt 111 is moved along the direction of arrow A.

In the vicinity of the belt roller 107, a nip roller 138 and a nip receiving roller 139 are disposed so as to hold the conveyance belt 111 therebetween. The nip roller 138 is pressed downward by an unshown spring. The nip receiving roller 139 disposed below the nip roller 138 receives via the conveyance belt 111 the nip roller 138 pressed downward. The two nip rollers are installed rotatably and are rotated interlockingly with the conveyance belt 111.

The printing paper P fed out from the paper feed unit 114 to the conveyance unit 120 is held between the nip roller 138 and the conveyance belt 111. Thereby, the printing paper P is pressed against the conveyance surface 127 of the conveyance belt 111 and is adhered to the conveyance surface 127. The printing paper P is then conveyed to a direction in which the liquid discharge head 2 is disposed, according to the rotation of the conveyance belt 111. An outer circumferential surface 113 of the conveyance belt 111 may be treated with adhesive silicone rubber. This allows the printing paper P to be surely adhered to the conveyance surface 127.

The liquid discharge head 2 has a head body 2a at a lower end thereof. A lower surface of the head body 2a serves as an discharge hole surface 4-1 provided with a large number of discharge holes for discharging liquid.

Four color liquid droplets (inks) are discharged from the discharge holes disposed in the single liquid discharge head 2. The discharge holes of the liquid discharge head 2 for discharging these colors are arranged at equal intervals in one direction, and hence each of these colors can be tightly printed in the one direction. The term "one direction" denotes a direction parallel to the printing papers P and orthogonal to the conveyance direction of the printing papers P, namely, the longitudinal direction of the liquid discharge head 2.

The colors of liquid discharged from the liquid discharge head 2 are, for example, magenta (M), yellow (Y), cyan (C) and black (K). The liquid discharge head 2 is disposed between the discharge hole surface 4-1 of the lower surface of the head body 2a and the conveyance surface 127 of the conveyance belt 111 while leaving a slight space therebetween.

The printing paper P conveyed by the conveyance belt 111 passes through the space between the liquid discharge head 2 and the conveyance belt 111, during which liquid droplets are discharged from the head body 2a constituting the liquid discharge head 2 toward the upper surface of the printing paper P. Thus, a color image based on image data stored by the control section 100 is formed on the upper surface of the printing paper P.

A peeling plate 140 and two pairs of feed rollers 121a, 121b, 122a and 122b are disposed between the conveyance unit 120 and the paper receiving part 116. The printing paper P having the color image printed thereon is conveyed to the peeling plate 140 by the conveyance belt 111. The printing paper P is then peeled off from the conveyance surface 127 by the right end of the peeling plate 140. Thereafter, the printing paper P is fed to the paper receiving part 116 by the feed rollers 121a, 121b, 122a and 122b. Thus, the printed printing paper P are sequentially fed to the paper receiving part 116 and are stacked on the paper receiving part 116.

A paper surface sensor 133 is disposed between the nip roller 138 and the liquid discharge head 2 located on the most upstream side in the conveyance direction of the printing papers P. The paper surface sensor 133 is comprised of a light emitting element and a light receiving element, and is capable of detecting a distal end position of the printing paper P on the conveyance passage. The distal end position of the printing paper P detected by the paper surface sensor 133 is sent as a detection result to the control section 100. On the basis of the detection result sent from the paper surface sensor 133, the control section 100 is capable of controlling the liquid discharge head 2 or the conveyance motor 174, or the like, so as to establish synchronization between the conveyance of the printing papers P and image printing.

Figure 2:
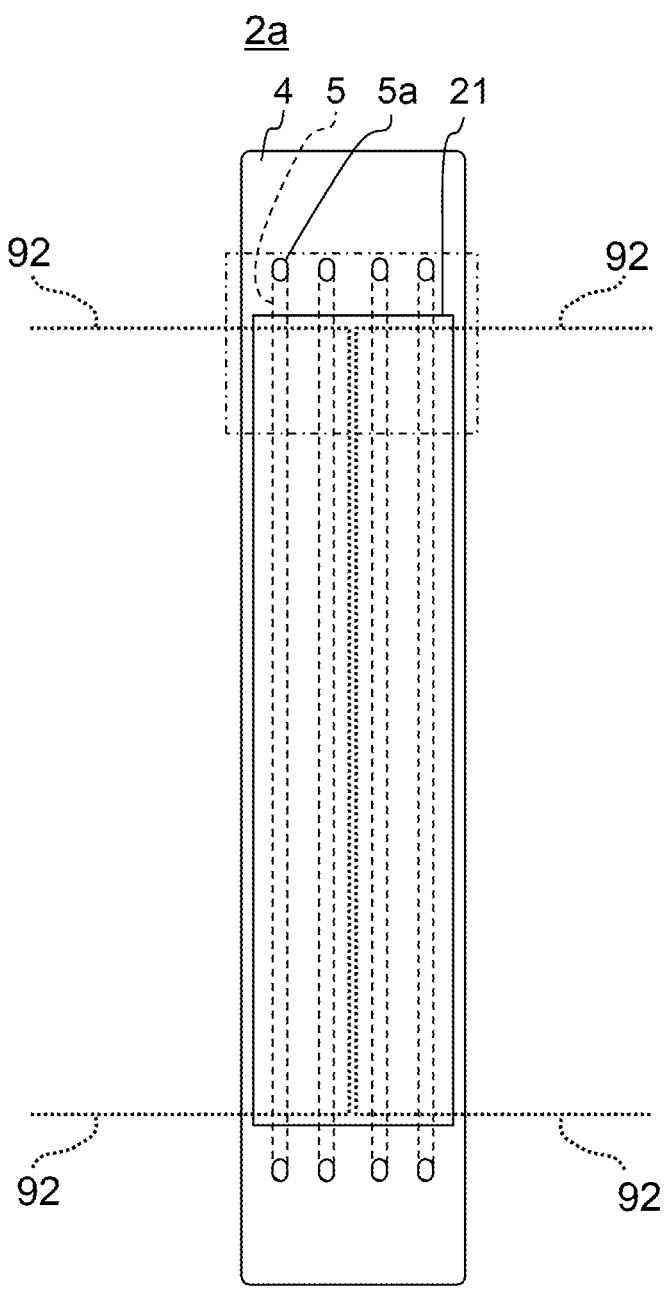
FIG. 2 is a top plan view of a passage member and a piezoelectric actuator that constitute the liquid discharge head in FIG. 1.
Figure 3:
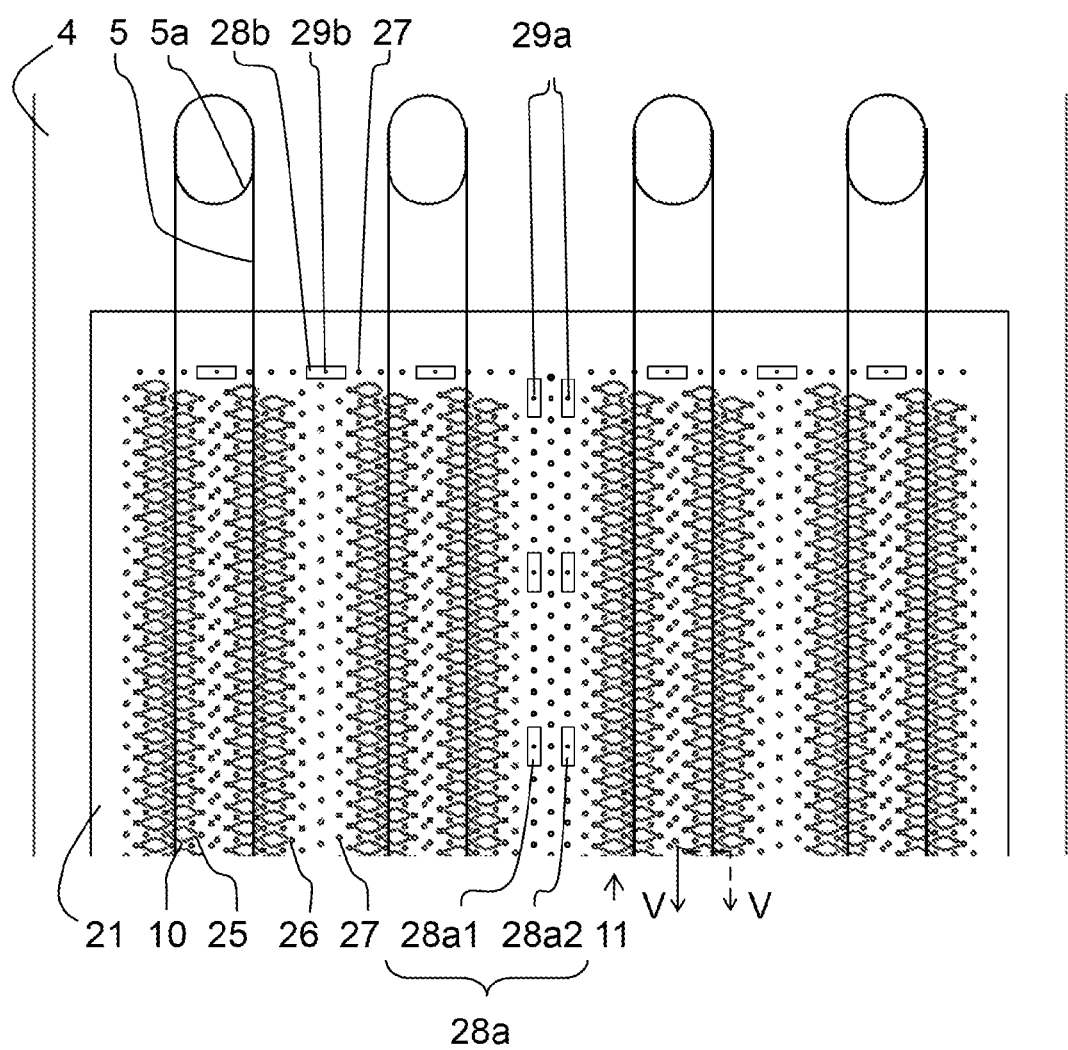
FIG. 3 is an enlarged view of a region surrounded by chain lines in FIG. 2, from which some passages are omitted for the sake of explanation.
Figure 4:
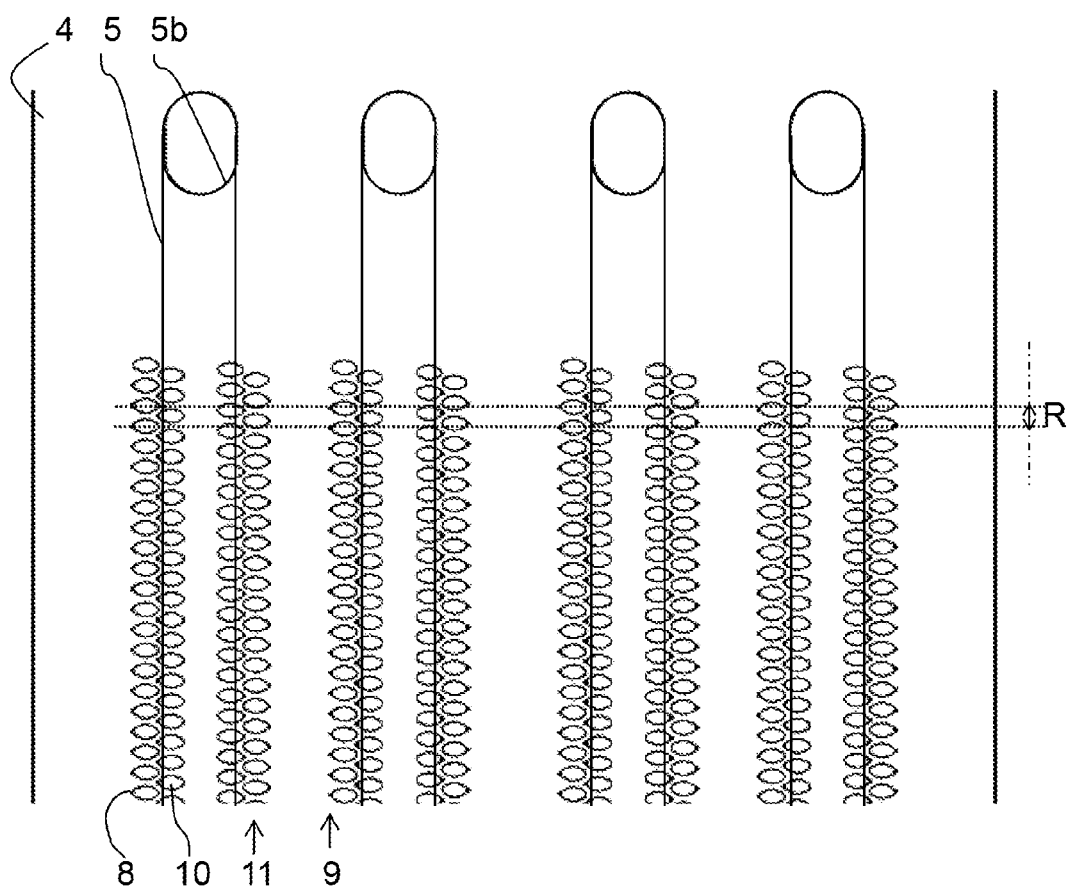
FIG. 4 is another enlarged view of the region surrounded by the chain lines in FIG. 2, from which some passages are omitted for the sake of explanation.
Figure 5:
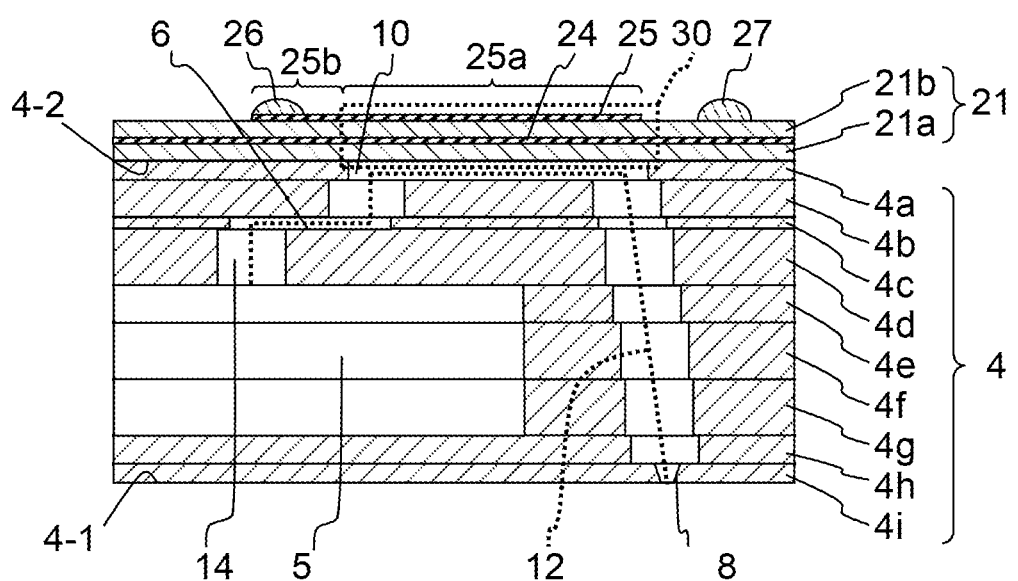
FIG. 5 is a longitudinal cross section taken along line V-V in FIG. 3.

Next, the liquid discharge head 2 of the present invention is described. FIG. 2 is a top plan view of the head body 2a. FIG. 3 is an enlarged view of a region surrounded by a long dashed short dashed line in FIG. 2, in which some passages are omitted for the sake of explanation. FIG. 4 is an enlarged view of the region surrounded by the long dashed short dashed line in FIG. 2, in which some passages different from that in FIG. 3 are omitted for the sake of explanation. In FIGS. 2 and 3, a manifold 5, the discharge hole 8 and the pressurizing chamber 10, all of which are located below the piezoelectric actuator substrate 21 and therefore should be drawn by a broken line, are drawn by a solid line for the sake of clarification. FIG. 5 is a longitudinal sectional view taken along the line V-V in FIG. 3.

The liquid discharge head 2 includes the head body 2a, a reservoir and a metal housing. The head body 2a includes a passage member 4 and the piezoelectric actuator substrate 21 having the displacement element 30 (refer to FIG. 5) formed thereon.

The passage member 4 constituting the head body 2a includes the manifold 5, a plurality of pressurizing chambers 10 connected to the manifold 5, and a plurality of discharge holes 8 respectively connected to a plurality of the pressurizing chambers 10. The pressurizing chambers 10 are opened to an upper surface of the passage member 4, and the upper surface of the passage member 4 serves as a pressurizing chamber surface 4-2. The upper surface of the passage member 4 has an opening 5a connected to the manifold 5, and liquid is supplied from the opening 5a.

The piezoelectric actuator substrate (piezoelectric actuator) 21 including the displacement element 30 is bonded to the upper surface of the passage member 4, and these displacement elements 30 are disposed so as to overlie the pressurizing chambers 10. A signal transmission section 92, such as an FPC (flexible printed circuit) for supplying a signal to these displacement elements 30, is connected to the piezoelectric actuator substrate 21. In FIG. 2, an external shape of the vicinity of a part of the signal transmission section 92 which is connected to the piezoelectric actuator 21 is indicated by a dotted line. Electrodes formed on the signal transmission part 92 are electrically connected to the piezoelectric actuator 21, and are arranged in a rectangular shape at an end part of the signal transmission section 92. The two signal transmission sections 92 are connected to each other so that their respective ends are located at a central part of the piezoelectric actuator substrate 21 in the transverse direction thereof. The two signal transmission sections 92 extend from the central part toward the long sides of the piezoelectric actuator substrate 21.

The supply of liquid to the passage member 4 is performed respectively from both end portions of the liquid discharge head 2. Therefore, in the case of supplying liquid having a different temperature from that of the liquid discharge head 2, temperature distributions in the longitudinal direction of the liquid discharge head 2 become substantially symmetric, thereby achieving an approximately uniform temperature distribution in the longitudinal direction.

The possibility of causing insufficient supply of liquid can be reduced by supplying the liquid from both ends of the manifold 5 to the passage member 4. A difference in pressure loss caused when the liquid passes through the manifold 5 can be reduced to approximately half of that when the liquid is supplied from one end of the manifold 5, thereby reducing variations in liquid discharge characteristics. Additionally, the supply of the liquid from both ends of the manifold 5 to the passage member 4 eliminates the need to increase the width of the liquid discharge head 2, thereby preventing the width of the discharge holes 8 from enlarging in the width direction thereof. In this case, even when a deviation occurs in an angle at which the liquid discharge head 2 is attached to the printer 1, the influence on a printing result can be reduced.

Even when printing is performed using a plurality of liquid discharge heads 2, it is capable of suppressing expansion of an area for arranging the discharge holes 8 in the entirety of a plurality of the liquid discharge heads 2. Therefore, even when variations occur in relative positional accuracy of a plurality of the liquid discharge heads 2, the influence on the printing result can be reduced. Hence, the liquid is preferably supplied from both ends of the manifold 5 in order to reduce the difference of pressure loss while decreasing the width of the liquid discharge head 2.

Also in order to reduce the pressure loss, an individual supply passage 14 opposed to the opening 5a of the manifold preferably goes downward in a straight line shape in a top plan view.

The head body 2a includes a plurality of the flat-plate shaped passage members 4 and the piezoelectric actuator substrate 21 disposed on the passage members 4 and having the displacement element 30. The shape of the piezoelectric actuator substrate 21 in a top plan view is a rectangle like shape, and the piezoelectric actuator substrate 21 is disposed on the upper surface of the passage members 4 so that the long sides of the rectangle like shape extend along the longitudinal direction of the passage members 4.

Four manifolds 5 are formed inside the passage member 4. These manifolds 5 have a long and narrow shape extending along the longitudinal direction of the passage member 4, and have at both ends thereof the opening 5a of the manifolds 5 located on the upper surface of the passage member 4. In the present embodiment, the four manifolds 5 are independently disposed and are respectively connected at the openings 5a to a branching passage (not shown).

The passage member 4 is formed by allowing a plurality of the pressurizing chambers 10 to expand two-dimensionally. Each of the pressurizing chambers 10 is a hollow region having a substantially rhombus shape with rounded corners in a top plan view. The pressurizing chamber 10 has an opening on the pressurizing chamber surface 4-2 that is the upper surface of the passage member 4.

The pressurizing chamber 10 is connected via the individual supply passage 14 to the single manifold 5. Two pressurizing chamber rows 11, each being a row of the pressurizing chambers 10 connected to the manifold 5 so as to extend along the manifold 5, are disposed at each of both sides of the manifold 5. That is, the manifold 5 includes a total of four such pressurizing chamber rows 11. Accordingly, 16 pressurizing chamber rows 11 are disposed in the entirety of the liquid discharge head 2.

The pressurizing chambers 10 are arranged at the same interval, namely 37.5 dpi, in the longitudinal direction thereof, in these pressurizing chamber rows 11. The pressurizing chambers 10 disposed at both ends of each of the pressurizing chamber rows 11 are dummy pressurizing chambers not connected to the manifolds 5. Owing to these dummy pressurizing chambers, a circumferential structure (rigidity) of the pressurizing chambers 10 located immediately next to both ends can be made more similar to the structure (rigidity) of other pressurizing chambers 10, thereby minimizing a difference in liquid discharge characteristics.

The pressurizing chambers 10 constituting each of the pressurizing chamber rows 11 are staggered so that their corner parts are located between the pressurizing chamber rows 11 adjacent to each other. A pressurizing chamber group is made up of the pressurizing chambers 10 connected to the single manifold 5, and there are four such pressurizing chamber groups. The pressurizing chambers 10 in these pressurizing chamber groups have a similar relative arrangement, and these pressurizing chamber groups are arranged so as to be shifted slightly in the longitudinal direction. These pressurizing chambers 10 are arranged over substantially the entire surface of a region on the upper surface of the passage member 4 which is opposed to the piezoelectric actuator substrate 21, even though including a part having a slightly larger interval, such as the space between the pressurizing chamber groups. That is, each of the pressurizing chamber groups 9 made up of the pressurizing chambers 10 occupies a region having substantially the same size and shape as the piezoelectric actuator substrate 21. The opening of each of the pressurizing chambers 10 is closed by the piezoelectric actuator unit 21 configured to be bonded to the upper surface of the passage member 4.

A descender connected to the discharge hole 8 that is opened to the discharge surface 4-1 of the lower surface of the passage member 4 is extended from a corner part of the pressurizing chamber 10 opposed to a corner part thereof to which the individual supply passage 14 is connected. The descender extends in a direction to extend a diagonal line of the pressurizing chamber in a top plan view. That is, the arrangement of the discharge holes 8 and the arrangement of the pressurizing chambers 10 in the longitudinal direction are identical to each other. In each of the pressurizing chamber rows 11, the pressurizing chambers 10 are arranged at the interval of 37.5 dpi, and the pressurizing chambers 10 connected to the single manifold are arranged at an interval of 150 dpi as a whole in the longitudinal direction. Further, the pressurizing chambers 10 connected to the four manifolds 5 are shiftedly arranged at an interval corresponding to 600 dpi in the longitudinal direction. Accordingly, the pressurizing chambers 10 are formed at the interval of 600 dpi as a whole in the longitudinal direction. As described above, the arrangement of the discharge holes 8 in the longitudinal direction is the same as that of the pressurizing chambers 10, and hence the interval of the discharge holes 8 in the longitudinal direction is also 600 dpi.

In other words, when the liquid discharge holes 8 are projected orthogonally to virtual straight lines parallel to the longitudinal direction of the passage member 4, the four discharge holes 8 respectively connected to these manifolds 5, namely, a total of 16 discharge holes 8 are arranged at equal intervals of 600 dpi in a range R of the virtual straight lines shown in FIG. 4. It is therefore capable of forming an image at a resolution of 600 dpi as a whole in the longitudinal direction by supplying identical color ink to all the manifolds 5. The four discharge holes 8 connected to the single manifold 5 are arranged at equal intervals of 150 dpi in the range R of the virtual straight lines.

Accordingly, it is capable of forming an image of four colors at a resolution of 150 dpi as a whole in the longitudinal direction by supplying different color inks to these manifolds 5. In this case, a four-color image may be formed at a resolution of 600 dpi by using four additional liquid discharge heads 2 so that each of the four color inks is supplied to the manifolds 5 located at different positions in each of these liquid discharge heads 2. Alternatively, a four-color image may be formed at a resolution of 300 dpi by using the two liquid discharge heads 2 so that each of the different color inks is supplied to the manifolds 5 located at different positions in each of these liquid discharge heads 2. The above configuration produces a beautiful image for the following reason. That is, in the identical color inks arranged in the main scanning direction on a recording medium P, the origin of discharge is located at different liquid discharge heads 2, more specifically the liquid discharge heads 2 in which the positions of the manifolds 5 differ from one another. Therefore, it is rare to consecutively cause discharge variations having a similar tendency, which reflect variations in the liquid discharge characteristics in each of these liquid discharge heads 2 or variations caused by the positions of the manifolds 5 in each of the liquid discharge heads 2.

Individual electrodes 25 are respectively formed at positions opposed to the pressurizing chambers 10 on the upper surface of the piezoelectric actuator substrate 21. Each of the individual electrodes 25 includes an individual electrode body 25a that is slightly smaller than the pressurizing chamber 10 and has a shape substantially similar to that of the pressurizing chamber 10, and an extraction electrode 25b extracted from the individual electrode body 25a. Similarly to the pressurizing chambers 10, the individual electrodes 25 constitute an individual electrode row and an individual electrode group. First surface electrodes 28a electrically connected to a common electrode 24 are formed on the upper surface of the piezoelectric actuator substrate 21.

The first surface electrodes 28a are disposed at a central part of the piezoelectric actuator substrate 21 in the transverse direction thereof, and includes first surface electrode rows 28a1 and 28a2 formed along the longitudinal direction thereof. Second surface electrodes 28b are disposed at an end part of the piezoelectric actuator substrate 21 in the longitudinal direction and are arranged along the transverse direction. The first surface electrodes 28a shown in FIG. 3 are formed intermittently on a straight line, or alternatively they may be formed continuously on the straight line. The two signal transmission sections 92 are arranged on the piezoelectric actuator substrate 21 so as to respectively go from the two long sides of the piezoelectric actuator substrate 21 to a central part thereof. The first surface electrodes 28a are respectively connected at an end part of the signal transmission sections 92. The first surface electrodes 28a have a larger area than the extraction electrode 25b and a connection electrode 26 formed thereon, thereby reducing the possibility that the signal transmission sections 92 are peeled off from their edges.

The discharge holes 8 are disposed at positions other than a region opposed to the manifolds 5 arranged on the lower surface of the passage member 4. The discharge holes 8 are also arranged in a region opposed to the piezoelectric actuator substrate 21 on the lower surface of the passage member 4. These discharge holes 8 occupy as a group a region having substantially the same size and shape as the piezoelectric actuator substrate 21. Liquid droplets are discharged from these discharge holes 8 by displacing the displacement elements 30 of the corresponding piezoelectric actuator substrate 21.

Each of the passage members 4 included in the head body 2a has a stacking structure having a plurality of plates stacked one upon another. These plates are a cavity plate 4a, a base plate 4b, an aperture plate 4c, a supply plate 4d, manifold plates 4e to 4g, a cover plate 4h and a nozzle plate 4i in descending order from the upper surface of the passage member 4. A large number of holes are formed in these plates. These plates having a thickness of approximately 10 to 300 μm can improve accuracy of formation of these holes. These plates are alignedly stacked one upon another so that these holes communicate with each other to constitute the individual passages 12 and the manifolds 5. In the head body 2a, the pressurizing chambers 10 are disposed on the upper surface of the passage member 4, and the manifolds 5 are disposed on the inside thereof and located closer to the lower surface thereof, and the discharge holes 8 are disposed on the lower surface thereof. That is, the components constituting the individual passages 12 are disposed adjacent to each other at different positions so that the manifolds 5 and the discharge holes 8 are connected to each other via the pressurizing chamber 10.

The holes formed in the foregoing plates are described below. These holes can be classified as follows. Firstly, there is the pressurizing chamber 10 formed in the cavity plate 4a. Secondly, there is a communication hole constituting the individual supply passage 14 connected from one end of the pressurizing chamber 10 to the manifold 5. This communication hole is formed in each of the plates in the range from the base plate 4b to the supply plate 4c. This individual supply passage 14 includes an aperture 6 as a portion that is formed in the aperture plate 4c and has a small cross-sectional area of the passage.

Thirdly, there is a communication hole constituting the passage communicated from the other end of the pressurizing chamber 10 to the discharge hole 8. This communication hole is referred to as the descender (partial passage) in the following description. The descender is formed in each of the plates in the range from the base plate 4b (specifically, an outlet of the pressurizing chamber 10) to the nozzle plate 4i (specifically, the discharge hole 8)

Fourthly, there is a communication hole constituting the manifold 5. This communication hole is comprised of the manifold plates 4e to 4g.

The first to fourth communication holes are connected to each other to form the individual passage 12 extending from an inlet of the liquid from the manifold 5 to the discharge hole 8. The liquid supplied to the manifold 5 is discharged from the discharge hole 8 through the following route. Firstly, the liquid goes upward from the manifold 5 and enters the individual supply passage 14 and reaches one end of the aperture 6. The liquid then goes horizontally along the extending direction of the aperture 6 and reaches the other end of the aperture 6. Subsequently, the liquid goes upward from there and reaches one end of the pressurizing chamber 10. Further, the liquid goes horizontally along the extending direction of the pressurizing chamber 10 and reaches the other end of the pressurizing chamber 10. The liquid then mainly goes downward while gradually moving horizontally from there, and goes to the discharge hole 8 opened to the lower surface.

The piezoelectric actuator substrate 21 has a stacking structure made up of two piezoelectric ceramic layers 21a and 21b. Each of these piezoelectric ceramic layers 21a and 21b has a thickness of approximately 20 μm. The thickness from the lower surface of the piezoelectric ceramic layer 21a to the upper surface of the piezoelectric ceramic layer 21b in the piezoelectric actuator substrate 21 is approximately 40 μm. Both of the piezoelectric ceramic layers 21a and 21b extend across a plurality of the pressurizing chambers 10. These piezoelectric ceramic layers 21a and 21b can be formed of ferroelectric lead zirconate titanate (PZT) based ceramic material.

The common electrode 24 made of a metal material, such as Ag—Pd based one, is formed inside the piezoelectric actuator substrate 21. The common electrode 24 is formed by co-firing together with the piezoelectric ceramic layers 21a and 21b. The co-firing provides a ceramic substrate in which the common electrode 24 is stacked on the piezoelectric ceramic layer (vibrating plate) 21a and the piezoelectric ceramic layer 21b is stacked on the common electrode 24. Then, various electrodes are baked on the ceramic substrate, thereby manufacturing the piezoelectric actuator substrate 21. These electrodes are made of a metal material, such as Au-based one, and examples thereof include the individual electrode 15 and the common electrode 24. Surface electrodes connected to the common electrode 24 are the first surface electrode 28a and the second surface electrode 28b (Hereinafter, the first surface electrode 28a and the second surface electrode 28b may be collectively referred to as the surface electrodes 28.). In the case of forming the surface electrodes 28 by another firing, a pattern, such as the individual electrode 25, is not formed when the ceramic substrate is fired, thus making it difficult to cause such shrinkage variations that shrinkage is different depending on location in a planar direction.

Additionally, the structure of the ceramic substrate in a stacking direction is substantially symmetric and therefore unsusceptible to warping. When the pattern, such as the individual electrode 25, is formed on the surface, the piezoelectric ceramic layers 21a and 21b differ from the individual electrode 25 in firing shrinkage or temperature range of the firing shrinkage. Consequently, warping occurs, and the amount of warping is large particularly when the piezoelectric actuator substrate 21 is as thin as 100 μm or less. It is therefore preferable to fire the ceramic substrate in a state that the surface electrodes 28 are not formed.

The first surface electrodes 28a are arranged at a central part of the piezoelectric ceramic substrate 21 in the transverse direction thereof so as to extend along the longitudinal direction thereof, thereby forming a plurality of first surface electrode rows 28a1 and 28a2. Hereinafter, these surface electrode rows may be referred to as one first surface electrode row 28a1 and the other first surface electrode row 28a2.

The first surface electrodes 28a constituting the first surface electrode rows 28a1 and 28a2 are disposed adjacent to each other. In other words, the first surface electrodes 28a constituting the one first surface electrode row 28a1 are disposed adjacent to the first surface electrodes 28a constituting the other first surface electrode row 28a2.

A first through hole 29a and a second through hole 29b (hereinafter collectively referred to as the through holes 29 in some cases) are formed in the piezoelectric ceramic layer 21b. The first surface electrode 28a is formed inside the first through hole 29a and on the upper surface of the piezoelectric ceramic layer 21b located therearound. The first surface electrode 28a and the common electrode 24 are electrically connected to each other by a conductor that is a part of the first surface electrode 28a disposed inside the first through hole 29a. The second surface electrode 28b is formed inside the second through hole 29b and on the upper surface of the piezoelectric ceramic layer 21b located therearound. The second surface electrode 28b and the common electrode 24 are electrically connected to each other by a conductor disposed inside the second through hole 29b. An actual electrical connection is performed by a part of a conductor obtained by firing conductor paste entered into the through holes 29 when forming the surface electrodes 28. Alternatively, a conductor may be separately loaded into the through holes 29 before being subjected to the co-firing. However, by ensuring a state that the conductor or the like is not loaded into the through holes 29 when firing the ceramic substrate, it is capable of reducing occurrence of shrinkage variations or warping due to the influence of the loaded conductor.

Although the second through hole 29b and the second surface electrode 28b are not necessarily needed, both enhance the effect of maintaining the potential of the common electrode 24 at ground potential. Additionally, the connection of the end part of the signal transmission section 92 to the second electrode 28b makes it difficult for the signal transmission section 92 to peel off from the end part thereof.

The individual electrode 25 includes the individual electrode body 25a disposed at a position opposed to the pressurizing chamber 10 on the upper surface of the piezoelectric actuator substrate 21, and the extraction electrode 25b extracted from the individual electrode body 25a. The individual electrode 25 is baked after firing the ceramic substrate, and hence can be formed with little or no influence of the shrinkage variations of the ceramic substrate, thereby enhancing positional accuracy. Accordingly, misregistration of the individual electrode 25 and the pressurizing chamber 10 can be minimized to reduce variations in displacement and variations in discharged characteristics due to the misregistration. The connection electrode 26 is formed at a portion of one end of the extraction electrode 25b which is extracted beyond the region opposed to the pressurizing chamber 10. The connection electrode 26 is made of, for example, Ag—Pd based one, and is formed in a convex shape with a thickness of approximately 15 µm. The connection electrode 26 is electrically connected to an electrode disposed on the signal transmission section 92. A driving signal is transmitted from the control section 100 to the individual electrode 25 via the signal transmission section 92. This is described in detail later. The driving signal is applied in a fixed cycle in synchronization with a conveying speed of a printing medium P. A dummy connection electrode 27 equalizes a pressing force on components when the piezoelectric actuator substrate 21 is connected to the passage member 4, thus permitting stable bonding.

The common electrode 24 is formed over substantially the entire surface in a planar direction in a region between the piezoelectric ceramic layer 21a and the piezoelectric ceramic layer 21b. That is, the common electrode 24 extends to cover all the pressurizing chambers 10 in the region opposed to the piezoelectric actuator substrate 21. The thickness of the common electrode 24 is approximately 2 µm. The common electrode 24 is connected via the through hole 29 formed in the piezoelectric ceramic layer 21b to the surface electrode 28 formed at a position that is kept away from an electrode group made up of the individual electrodes 25 on the piezoelectric ceramic layer 21b. The common electrode is grounded and maintained at the ground potential. The surface electrode 28 is electrically connected to the electrode on the signal transmission section 92 similarly to the large number of individual electrodes 25.

As described above, the positional accuracy of the individual electrodes 25 can be enhanced by co-firing the ceramic substrate and by baking the surface electrode 28. However, the position of the though holes 29 is affected by dimensional variations due to the shrinkage variations of the ceramic substrate. Compared to the individual electrodes 25, the positional accuracy of the through holes 29 is required to ensure opening at a position overlapped with the surface electrode 28 and ensure an electrical connection of the common electrode 24 and the surface electrode 28. By increasing the area of a region including neither the surface electrode 28 nor the individual electrode 25 formed therearound, the electrical connection can be ensured even when the dimensional variations occur. This configuration, however, seems to increase the size of the liquid discharge head 2 in the planar direction, thus deteriorating printing accuracy.

Therefore, the first surface electrode 28a is configured to be long in the longitudinal direction of the piezoelectric actuator substrate 21 by arranging the first through holes 29a at a central part of the piezoelectric actuator substrate 21 in the transverse direction thereof so as to extend along the longitudinal direction. The dimensional variations due to the shrinkage variations during the firing of the ceramic substrate occur substantially in proportion to a distance from the center of the ceramic substrate in the planar direction. Hence, by disposing the first through holes 29a at the central part of the piezoelectric actuator substrate 21 in the transverse direction, the positional variations of the first through holes 29a are substantially limited in the longitudinal direction of the piezoelectric actuator substrate 21, and the variation in the transverse direction can be minimized. Therefore, the first surface electrode 28a can be disposed so as to perform alignment between the first surface electrode 28a and the first through hole 29a without increasing the size of the piezoelectric actuator substrate 21 in the transverse direction thereof. The size of the first surface electrode 28a in the transverse direction of the piezoelectric actuator substrate 21 can be set to 5% or less, more preferably 2% or less of the length of the piezoelectric actuator substrate 21 in the transverse direction. Thus, by reducing the size of the surface electrode 28a in the transverse direction of the piezoelectric actuator substrate 21, the width of the actuator substrate 21 and the width of the liquid discharge head 2 can be decreased to enhance printing accuracy.

Owing to the configuration that the length of the first surface electrode 28a in the longitudinal direction of the piezoelectric actuator substrate 21 is larger than the size thereof in the transverse direction of the piezoelectric actuator 21, the electrical connection of the first surface electrode 28a and the common electrode 24 can be ensured even when the positions of the first through holes 29a vary in the longitudinal direction due to firing variations of the semiconductor substrate. The electrical connection reliability can be improved particularly in the first surface electrodes 28a located on the circumference of the end parts in the longitudinal direction.

The ground potential can be easily and stably maintained by disposing a plurality of the first through holes 29a along the longitudinal direction of the piezoelectric actuator substrate 21. Particularly, the ground potential can be easily and stably maintained over the entire region of the common electrode 24 by disposing the first through holes 29a from one end to the other end of the piezoelectric actuator substrate 21 in the longitudinal direction thereof.

In one aspect, the first surface electrode 28a preferably extends continuously from one end to the other end in the longitudinal direction of the piezoelectric actuator substrate 21 from the viewpoint of alignment with respect to the first through hole 29a or the stability of ground potential. In another aspect, when the first surface electrode 28a extends long continuously, the piezoelectric actuator substrate 21 may warp due to the shrinkage of the first surface electrode 28a during baking. Hence, the first surface electrodes 28a are preferably disposed by dividing them into a plurality of groups without increasing the size of the piezoelectric actuator substrate 21 in the longitudinal direction. The size of the first surface electrode 28a in the longitudinal direction of the piezoelectric actuator substrate 21 is preferably 5% or less, particularly 2% or less of the length of the piezoelectric actuator substrate 21 in the longitudinal direction.

In addition to the above-mentioned first surface electrode 28a and first through hole 29a, a second through hole 29b extending through the piezoelectric ceramic layer 21b and a second surface electrode 28b connected to the second through hole 29b may be disposed on at least one of the ends of the piezoelectric actuator substrate 21 in the longitudinal direction. The second through hole 29b and the second surface electrode 28b contribute to the stability of the ground potential of the common electrode 24, and also ensures a strong connection of the electrodes at the end part of the signal transmission section 92.

Even when the position of the second through hole 29b varies by the variation of the piezoelectric actuator substrate 21 in the transverse direction during the firing of the ceramic substrate, the alignment of the second through hole 29b is ensured by allowing the second surface electrode 28b to have a shape that is long in the transverse direction of the piezoelectric actuator substrate 21. The area of the second surface electrode 28b may be increased with increasing the size of the second surface electrode 28b in the longitudinal direction of the piezoelectric actuator substrate 21. Consequently, the piezoelectric actuator substrate 21 may warp during baking of the second surface electrode 28b. Therefore, the length of the second surface electrode 28b in the longitudinal direction of the piezoelectric actuator substrate 21 is preferably shorter than the length of the piezoelectric actuator substrate 21 in the transverse direction.

The above-mentioned effect can be further enhanced by disposing the second surface electrode 28b and the second through hole 29b at both ends of the piezoelectric actuator substrate 21 in the longitudinal direction. The above-mentioned effect can be further enhanced by disposing a plurality of second surface electrodes 28b and second through holes 29b at both ends of the piezoelectric actuator substrate 21 so that they exist from one end to the other end in the transverse direction.

The second surface electrode 28b may also be disposed continuously from one end to the other end in the transverse direction of the piezoelectric actuator substrate 21 from the viewpoint of alignment with respect to the second through hole 29b or the viewpoint of stability of the ground potential.

Next, the displacement element 30 is described below. By selectively applying a predetermined driving signal to the individual electrode 25, a pressure is applied to the liquid in the pressurizing chamber 10 corresponding to the individual electrode 25. Consequently, the liquid droplets are discharged from the corresponding liquid discharge hole 8 via the individual passage 12. That is, a part of the piezoelectric actuator substrate 21 opposed to each of the pressurizing chambers 10 corresponds to the individual displacement element 30 corresponding to each pressurizing chamber 10 and the liquid discharge hole 8. Specifically, in a stacked body made up of the two piezoelectric ceramic layers, the displacement element 30 whose unit structure is the structure as shown in FIG. 5 is formed in each of the pressurizing chambers 10 by using the vibrating plate 21a, the common electrode 24, the piezoelectric ceramic layer 21b and the individual electrode 25, which are located immediately above the pressurizing chamber 10. The piezoelectric actuator substrate 21 includes a plurality of the displacement elements 30 functioning as a pressurizing part. In the present embodiment, the amount of the liquid discharged from the liquid discharge hole 8 by a single discharge operation is approximately 5 to 7 pl (pico litter).

A large number of individual electrodes 25 are individually electrically connected via the signal transmission section 92 and wiring to the control section 100 so that their respective potential can be controlled individually. When an electric field is applied to the piezoelectric ceramic layer 21b in its polarization direction by setting the individual electrodes 25 at a different potential from that of the common electrode 24, an area to which the electric field has been applied functions as an active region that is distorted due to piezoelectric effect. When in this configuration, the individual electrode 25 is set to a predetermined positive or negative potential with respect to the common electrode 24 by the control section 100 so that the electric field and the polarization are oriented in the same direction, a region (active region) held between the electrodes of the piezoelectric ceramic layer 21b contracts in the planar direction. On the other hand, the piezoelectric ceramic layer 21a as a non-active layer is not affected by the electric field, and therefore does not contract spontaneously but tends to restrict the deformation of the active region. Consequently, there occurs a difference in distortion in the polarization direction between the piezoelectric ceramic layer 21b and the piezoelectric ceramic layer 21a, and the piezoelectric ceramic layer 21b is deformed to project toward the pressurizing chamber 10 (unimolf deformation).

According to an actual driving procedure in the present embodiment, the individual electrode 25 is previously set at a higher potential than the common electrode 24 (hereinafter referred to as a high potential). Then, the individual electrode 25 is temporarily set at the same potential as the common electrode 24 (hereinafter referred to as a low potential) every time an discharge request is made, and thereafter the individual electrode 25 is again set at the high potential at a predetermined timing. Thereby, the piezoelectric ceramic layers 21a and 21b return to their original shape at the timing that the individual electrode 25 has the low potential, and the volume of the pressurizing chamber 10 is increased than that in its initial state (a state that the potentials of both electrodes are different from each other). At this time, a negative pressure is applied into the pressurizing chamber 10, and the liquid is absorbed from the manifold 5 into the pressurizing chamber 10. Thereafter, at the timing that the individual electrode 25 is again set at the high potential, the piezoelectric ceramic layers 21a and 21b are deformed to project toward the pressurizing chamber 10. Then, due to the reduced volume in the pressurizing chamber 10, the pressure inside the pressurizing chamber 10 becomes a positive pressure and the pressure applied to the liquid is increased to discharge the liquid drops. That is, the driving signal containing pulses using the high potential as a datum is supplied to the individual electrode 25 for the purpose of discharging the liquid drops. An ideal pulse width is AL (acoustic length) that is a length of time during which a pressure wave propagates from the aperture 6 to the discharge hole 8. Thereby, when a negative pressure state in the pressurizing chamber 10 is reversed into a positive pressure state, both pressures are combined together, thus allowing the liquid drops to be discharged under a stronger pressure.

In gradation printing, a gradation expression is carried out by the amount (volume) of liquid drops adjusted by the number of liquid drops continuously discharged from the discharge hole 8, namely, the number of discharges of liquid drops. Therefore, the number of discharges of liquid drops corresponding to a designated gradation expression are carried out continuously from the discharge holes 8 corresponding to a designated dot region. When the liquid discharge is carried out continuously, it is generally preferable that the intervals between pulses supplied for discharging the liquid drops be set at the AL. Thereby, the cycle of a residual pressure wave of a pressure generated when previously discharged liquid drops are discharged coincides with the cycle of a pressure wave of a pressure generated when liquid drops discharged later are discharged, and these two pressure waves are superimposed to amplify the pressure for discharging the liquid drops. In this case, the speed of the liquid drops discharged later seems to be increased, however, this is preferred because a plurality of landing points of the liquid drops become closer to each other.

The foregoing piezoelectric actuator substrate 21 is manufactured, for example, in the following manner. With a general tape forming method, such as roll coater method or slit coater method, the formation of a tape made of piezoelectric ceramic powder and an organic composition is performed to manufacture a plurality of green sheets that are then subjected to firing and become the piezoelectric ceramic layers 21a and 21b. Electrode paste serving as the common electrode 24 is formed on the surface of a part of each of these green sheets by printing method or the like. The through holes 29 are provided in the green sheet that becomes the piezoelectric ceramic layer 21b.

Subsequently, a stacked body is manufactured by stacking these green sheets one upon another, and the stacked body is then subjected to pressure adhesion. A ceramic substrate is manufactured by co-firing the stacked body after being subjected to the pressure adhesion in a high oxygen concentration atmosphere. In the ceramic substrate, the piezoelectric ceramic layer 21a, the common electrode 24 and the piezoelectric ceramic layer 21b are stacked one upon another, and the through hole 29 connected to the common electrode 24 is opened to the piezoelectric ceramic layer 21b. Thereafter, Au paste that becomes the individual electrodes 25 and the surface electrodes 28 is printed on the surface of the ceramic substrate by using organic gold paste, followed by firing and baking. A part of the Au paste printed on the through hole 29 and therearound is stored inside the through hole 29. By firing this, the surface electrode 28 is baked inside the through hole 29 and on the common electrode 24 located on the bottom of the through hole 29, and electrical continuity between the surface electrode 28 and the inside electrode 24 on the surface of the piezoelectric actuator substrate 21 is established by the surface electrode 28 baked inside the through hole 29. Thereafter, the piezoelectric actuator substrate 21 is manufactured by printing the connection electrode 26 and the dummy connection electrode 27 by using Ag paste, followed by firing as needed.

Subsequently, the passage member 4 is manufactured by stacking plates 4a to 4i, which are obtained by rolling method or the like, with an adhesive layer interposed therebetween. Holes serving as the manifold 5, the individual supply passage 14, the pressurizing chambers 10 and the descender or the like are provided in these plates 4a to 4i and processed into their respective predetermined shapes by etching.

These plates 4a to 4i are preferably formed by at least one kind of metal selected from the group consisting of Fe—Cr based ones, Fe—Ni based ones and WC—TiC based ones. Particularly, when ink is used as the liquid, these plates are preferably made of a material having excellent corrosion resistance to the ink. Hence, the Fe—Cr based ones are more preferred.

The piezoelectric actuator unit 21 and the passage member 4 can be stacked and bonded together, for example, with an adhesive layer interposed therebetween. As the adhesive layer, a well-known one may be used. However, in order to avoid the influence on the piezoelectric actuator unit 21 and the passage member 4, it is preferable to use thermosetting resin adhesive of at least one kind selected from the group consisting of epoxy resin, phenol resin and polyphenylene ether resin, each having a heat-cure temperature of 100-150° C. The piezoelectric actuator unit 21 and the passage member 4 can be heat-connected with each other by using and heating the adhesive layer up to the heat-cure temperature thereof.

Then, in order to electrically connect the piezoelectric actuator unit 21 and the control section 100, silver paste is supplied to the connection electrode 26, and an FPC that is the signal transmission section 92 having a driver IC previously mounted thereon is disposed thereon. The silver paste is thermally cured and electrically connected by applying heat thereto. In the mounting of the driver IC, flip-chip electrical connection to the FPC is achieved by soldering, and thereafter, protective resin is supplied to the circumference of the solder, followed by curing. Thereafter, a reservoir or housing is attached as needed, thereby manufacturing the liquid discharge head 2.

A liquid discharge head 2 according to other embodiment is described with reference to FIG. 6. Identical members are denoted by the same reference numerals.

The liquid discharge head 2 is different from the foregoing liquid discharge head 2 in the arrangement of the first surface electrodes 28a disposed at the central part of the piezoelectric actuator substrate 21 in the transverse direction. Further, the first surface electrodes 28a disposed at the central part of the piezoelectric actuator substrate 21 in the transverse direction are electrically connected to a plurality of first through holes 29a. The second surface electrode 28b located at the end part of the piezoelectric actuator substrate 21 in the longitudinal direction is electrically connected to a plurality of second through holes 29b.

Figure 6:
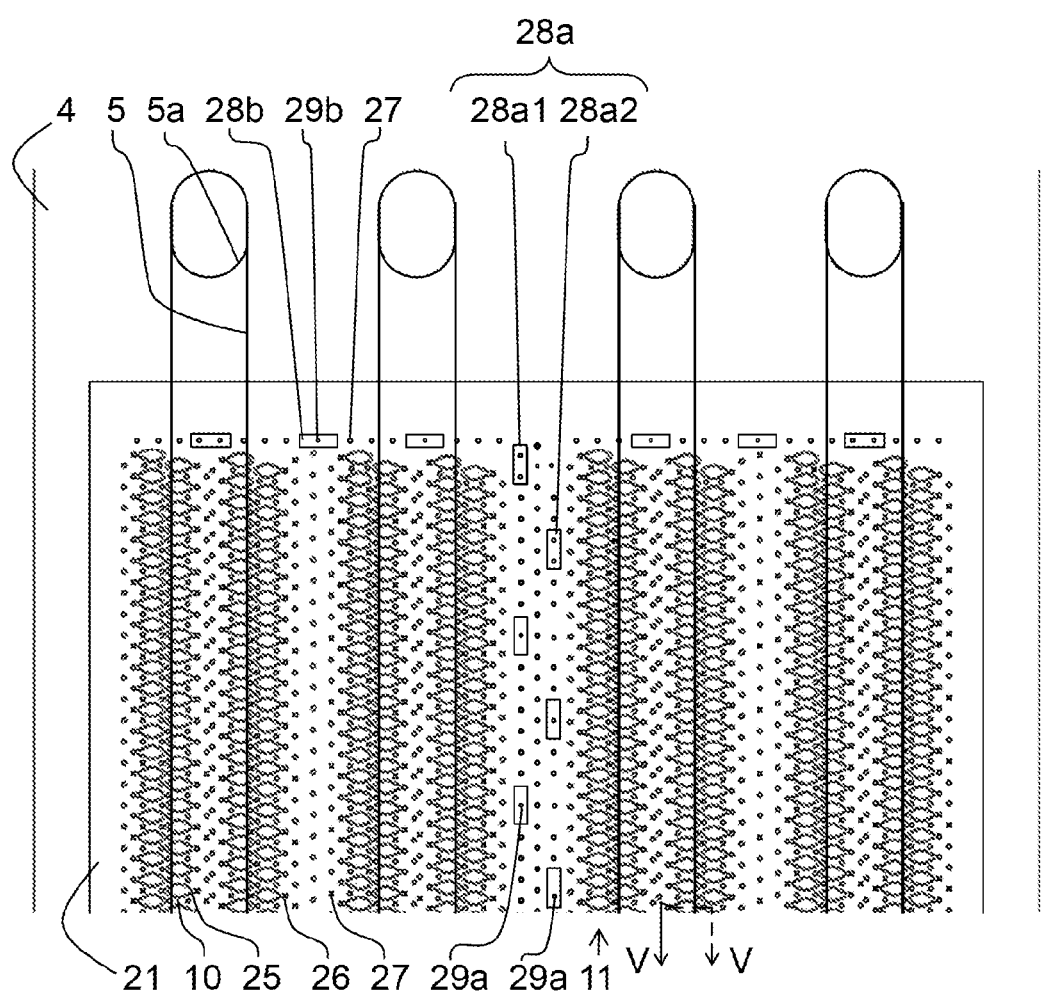
FIG. 6 is an enlarged diagram corresponding to FIG. 3 and showing a piezoelectric actuator according to other embodiment of the present invention.

In the liquid discharge head 2 shown in FIG. 6, each of the first surface electrodes 28a includes one first surface electrode row 28a1 and the other first surface electrode row 28a2. The first surface electrodes 28a constituting the one first surface electrode row 28a1 and the first surface electrodes 28a constituting the other first surface electrode row 28a2 are shiftedly arranged in the longitudinal direction of the piezoelectric actuator substrate 21.

Therefore, a stress caused in the piezoelectric actuator substrate 21 due to the first surface electrodes 28a in the transverse direction of the piezoelectric actuator substrate 21 can be unified in the longitudinal direction of the piezoelectric actuator substrate 21. That is, the first surface electrodes 28a constituting the one first surface electrode row 28a1 and the first surface electrodes 28a constituting the other first surface electrode row 28a2 are configured not to be adjacent to each other in the transverse direction of the piezoelectric actuator substrate 21. Hence, when the piezoelectric actuator substrate 21 is viewed in the transverse direction, the first surface electrodes 28a are arranged equally without being overlapped with each other. It is therefore capable of mitigating the stress caused in the piezoelectric actuator substrate 21 due to the first surface electrodes 28a.

With regard to positional variations of the first through holes 29a in the longitudinal direction of the piezoelectric actuator substrate 21, a plurality of first through holes 29a are provided in the single first surface electrode 28a so as to establish an electrical connection via a conductor that is a part of the first surface electrode 28a in the inside of any one of the first through holes 29a. This configuration can suppress the warping of the piezoelectric actuator substrate 21 and also enhance reliability of the electrical connection. By disposing a plurality of the first through holes 29a at different positions in the longitudinal direction of the piezoelectric actuator substrate 21, these first through holes 29a can increase the possibility that the first surface electrode 28a is connected to any one of the first through holes 29a against the misregistration in the longitudinal direction caused during the firing of the ceramic substrate.

As shown in FIG. 6, the first surface electrode 28a located at the end part of the piezoelectric actuator 21 which causes large deformation is connected to a plurality of the first through holes 29a. It is therefore capable of improving electrical connection reliability of the first surface electrode 28a and the first through hole 29a even at the end part of the piezoelectric actuator 21 in the longitudinal direction which causes the large deformation.

Similarly, with regard to positional variations of the second through holes 29b in the longitudinal direction of the piezoelectric actuator substrate 21, a plurality of second through holes 29b are provided in the single first surface electrode 28a so as to establish an electrical connection via a conductor that is a part of the first surface electrode 28a in the inside of any one of the second through holes 29b. This configuration can suppress the warping of the piezoelectric actuator substrate 21 and also enhance reliability of the electrical connection.

By disposing a plurality of the second through holes 29b at different positions in the longitudinal direction of the piezoelectric actuator substrate 21, these second through holes 29b can increase the possibility that the second surface electrode 28b is connected to any one of the second through holes 29b against the misregistration in the longitudinal direction caused during the firing of the ceramic substrate.

As shown in FIG. 6, the second surface electrode 28b located at the end part of the piezoelectric actuator 21 causing large deformation is connected to a plurality of the second through holes 29b. It is therefore capable of improving electrical connection reliability of the second surface electrode 28b and the second through hole 29b even at the end part of the piezoelectric actuator 21 in the longitudinal direction which causes the large deformation.

The second surface electrode 28b includes one second surface electrode row and the other second surface electrode row, which are not shown. The second surface electrodes 28b constituting the one second surface electrode row and the second surface electrodes 28b constituting the other second surface electrode row may be shiftedly arranged in the transverse direction of the piezoelectric actuator substrate 21. Also in this case, the stress distribution at the end part of the piezoelectric actuator substrate 21 can be made closer to a uniform stress distribution.

The foregoing case where the second surface electrode 28b located at the end part of the piezoelectric actuator substrate 21 in the longitudinal direction is electrically connected to a plurality of the second through holes 29b, and the foregoing case where the first surface electrode 28b located at the central part of the piezoelectric actuator substrate 21 in the transverse direction is electrically connected to a plurality of the first through holes 29a have been described by way of example. For example, all the surface electrodes 28 may be electrically connected to the first through holes 29a or the second through holes 29b.

DESCRIPTION OF REFERENCE NUMERALS

1: printer
2: liquid discharge head
2a: head body
4: passage member
4a to 4i: plates
4-1: discharge hole surface
4-2: pressurizing chamber surface
5: manifold
5a: opening
6: aperture
8: discharge hole
9: discharge hole row
10: pressurizing chamber
11: pressurizing chamber row
12: individual passage
14: individual supply passage
21: piezoelectric actuator substrate
21a: piezoelectric ceramic layer (vibrating plate)
21b: piezoelectric ceramic layer
24: common electrode
25: individual electrode
25a: individual electrode body
25b: extraction electrode
26: connection electrode
27: dummy connection electrode
28a: first surface electrode
28b: second surface electrode
29a: first through hole
29b: second through hole
30: displacement element (pressurizing part)
92: signal transmission section

What is claimed is:
1. A piezoelectric actuator, comprising:
a ceramic substrate being long in a first direction, a plurality of individual electrodes, and a plurality of first surface electrodes, wherein
the ceramic substrate comprises a vibrating plate, a common electrode disposed on the vibrating plate, and a piezoelectric ceramic layer disposed on the common electrode and having a surface,
the piezoelectric ceramic layer has a plurality of first through holes connected to the surface and the common electrode,
a plurality of the individual electrodes are disposed in a region of the surface of the piezoelectric ceramic layer opposed to the common electrode,
a plurality of the first surface electrodes have a part disposed inside a plurality of the first through holes in the piezoelectric ceramic layer and a part disposed on a circumference of a plurality of the first through holes on the surface of the piezoelectric ceramic layer,
the surface of the piezoelectric layer has a second direction orthogonal to the first direction,
a plurality of the first through holes are arranged along the first direction at a central part of the ceramic substrate in the second direction when viewing the surface, and
the first surface electrodes located on the surface of the piezoelectric ceramic layer are long in the first direction.
2. The piezoelectric actuator according to claim 1, wherein
a plurality of the first surface electrodes comprises one first surface electrode row and the other first surface electrode row, and
the first surface electrodes constituting the one first surface electrode row and the first surface electrodes constituting the other first surface electrode row are shiftedly arranged in the first direction.
3. The piezoelectric actuator according to claim 1, wherein
a second surface electrode is further disposed,
a plurality of second through holes connected to the surface of the piezoelectric ceramic layer and the common electrode are disposed at least one of end parts of the ceramic substrate in the first direction,
the second surface electrode has a part disposed inside the second through hole in the piezoelectric ceramic layer and a part disposed on a circumference of the second through hole on the surface of the piezoelectric ceramic layer, and
the second surface electrode located on the surface of the piezoelectric ceramic layer is long in the second direction.
4. The piezoelectric actuator according to claim 3, wherein
a plurality of the second through holes are disposed,
a plurality of the second through holes are arranged along the second direction at least one of end parts of the ceramic substrate in the first direction, and
an arrangement is made so that the second surface electrode located on the surface of the piezoelectric ceramic layer is overlapped with the two or more second through holes.
5. The piezoelectric actuator according to claim 1, wherein
an arrangement is made so that the first surface electrode located on the surface of the piezoelectric ceramic layer is overlapped with the two or more first through holes.

6. A liquid discharge head, comprising:
the piezoelectric actuator according to claim 1; and
a passage member comprising a plurality of discharge holes and a plurality of pressurizing chambers respectively connected to a plurality of the discharge holes, a plurality of the pressurizing chambers and a plurality of the individual electrodes being overlappedly stacked one upon another on a side of the piezoelectric actuator located closer to the vibrating plate.

7. A recording device, comprising:
the liquid discharge head according to claim 6;
a conveyance section for conveying a recording medium to the liquid discharge head; and
a control section for controlling a voltage applied to a plurality of the individual electrodes.

8. The piezoelectric actuator according to claim 1, wherein
lengths of the first direction of the first surface electrodes located on the surface of the piezoelectric ceramic layer are longer than lengths of the second direction.

9. The piezoelectric actuator according to claim 1, wherein
the first surface electrodes are disposed continuously from one end to the other end in the first direction in the surface of the piezoelectric ceramic layer.

10. The piezoelectric actuator according to claim 1, wherein
a plurality of the first surface electrodes comprise one first surface electrode row and the other first surface electrode row, and
the first surface electrodes constituting the one first surface electrode row and the first surface electrodes constituting the other first surface electrode row are arranged adjacent to each other in the second direction.

11. The piezoelectric actuator according to claim 1, wherein
the first surface electrode is arranged at the end part of the first direction in the surface of the piezoelectric ceramic layer.

12. The piezoelectric actuator according to claim 3, wherein
the second surface electrode and the second through hole are disposed at both ends of the first direction of the ceramic substrate.

13. The piezoelectric actuator according to claim 3, wherein
a plurality of the second surface electrodes and the second through holes are disposed in the second direction.

14. The piezoelectric actuator according to claim 3, wherein the second surface electrodes are disposed continuously from one end to the other end in the second direction in the surface of the piezoelectric ceramic layer.

15. The piezoelectric actuator according to claim 3, wherein
a plurality of the second surface electrodes comprise one second surface electrode row and the other second surface electrode row, and
the second surface electrodes constituting the one second surface electrode row and the second surface electrodes constituting the other second surface electrode row are shiftedly arranged in the second direction.

16. The piezoelectric actuator according to claim 3, wherein
lengths of the second direction of the second surface electrodes located on the surface of the piezoelectric ceramic layer are longer than lengths of the first direction.

17. A piezoelectric actuator, comprising:
a ceramic substrate being long in a first direction, a plurality of individual electrodes, and a plurality of first surface electrodes, wherein
the ceramic substrate comprises a vibrating plate, a common electrode disposed on the vibrating plate, and a piezoelectric ceramic layer disposed on the common electrode and having a surface,
the piezoelectric ceramic layer has a plurality of first through holes connected to the surface and the common electrode,
a plurality of the individual electrodes are disposed in a region of the surface of the piezoelectric ceramic layer opposed to the common electrode,
a plurality of the first surface electrodes have a part disposed inside a plurality of the first through holes in the piezoelectric ceramic layer and a part disposed on a circumference of a plurality of the first through holes on the surface of the piezoelectric ceramic layer, and
the first surface electrodes located on the surface of the piezoelectric ceramic layer are long in the first direction.

18. The piezoelectric actuator according to claim 17, wherein
the surface of the piezoelectric ceramic layer has a second direction orthogonal to the first direction, and
lengths of the first direction of the first surface electrodes located on the surface of the piezoelectric ceramic layer are longer than lengths of the second direction.

19. The piezoelectric actuator according to claim 1, wherein
the surface of the piezoelectric ceramic layer has a second direction orthogonal to the first direction, and
lengths of the first direction of the ceramic substrate are longer than lengths of the second direction.

20. A piezoelectric actuator, comprising:
a ceramic substrate being long in a first direction, a plurality of individual electrodes, and a plurality of first surface electrodes, wherein
the ceramic substrate comprises a vibrating plate, a common electrode disposed on the vibrating plate, and a piezoelectric ceramic layer disposed on the common electrode and having a surface,
the ceramic layer has a plurality of first through holes connected to the surface and the common electrode,
a plurality of the individual electrodes are disposed in a region of the surface of the piezoelectric ceramic layer opposed to the common electrode,
a plurality of the first surface electrodes have a part disposed inside a plurality of the first through holes in the piezoelectric ceramic layer and a part disposed on a circumference of a plurality of the first through holes on the surface of the piezoelectric ceramic layer,
the surface of the piezoelectric ceramic layer has a second direction orthogonal to the first direction, and
a plurality of the first surface electrodes are arranged along the first direction at a central part of the ceramic substrate in the second direction when viewing for surface.

* * * * *